(12) United States Patent
Toda et al.

(10) Patent No.: US 8,390,105 B2
(45) Date of Patent: Mar. 5, 2013

(54) LEAD FRAME SUBSTRATE, MANUFACTURING METHOD THEREOF, AND SEMICONDUCTOR APPARATUS

(75) Inventors: Junko Toda, Kasukabe (JP); Susumu Maniwa, Kasukabe (JP); Yasuhiro Sakai, Tamana (JP); Takehito Tsukamoto, Tokorozawa (JP)

(73) Assignee: Toppan Printing Co., Ltd., Tokyo (JP)

( * ) Notice: Subject to any disclaimer, the term of this patent is extended or adjusted under 35 U.S.C. 154(b) by 12 days.

(21) Appl. No.: 12/998,098

(22) PCT Filed: Sep. 28, 2009

(86) PCT No.: PCT/JP2009/004932
§ 371 (c)(1),
(2), (4) Date: Mar. 17, 2011

(87) PCT Pub. No.: WO2010/035499
PCT Pub. Date: Apr. 1, 2010

(65) Prior Publication Data
US 2011/0163433 A1    Jul. 7, 2011

(30) Foreign Application Priority Data
Sep. 29, 2008    (JP) ................................ P2008-250799

(51) Int. Cl.
*H01L 23/495* (2006.01)
*H01L 21/00* (2006.01)

(52) U.S. Cl. ........ 257/676; 257/666; 257/672; 257/674; 257/E23.031; 257/E23.036; 257/E23.037; 438/111; 438/112; 438/123

(58) Field of Classification Search .......... 257/666–677, 257/E23.004, E23.031–E23.059; 438/111, 438/112, 123, FOR. 366, FOR. 367, FOR. 377, 438/FOR. 380
See application file for complete search history.

(56) References Cited

U.S. PATENT DOCUMENTS

| | | | |
|---|---|---|---|
| 6,476,469 B2 * | 11/2002 | Hung et al. | 257/676 |
| 6,858,919 B2 * | 2/2005 | Seo et al. | 257/666 |
| 6,882,048 B2 | 4/2005 | Ikenaga et al. | |
| 7,301,225 B2 * | 11/2007 | Wong et al. | 257/666 |

(Continued)

FOREIGN PATENT DOCUMENTS

| | | |
|---|---|---|
| JP | 2000-012758 | 1/2000 |
| JP | 2000-091488 | 3/2000 |

(Continued)

OTHER PUBLICATIONS

International Search Report for PCT/JP2009/004932, mailed Oct. 27, 2009.

*Primary Examiner* — Jasmine Clark

(57) ABSTRACT

A lead frame substrate, including: a metal plate having a first surface and a second surface; a semiconductor element mount portion and a semiconductor element electrode connection terminal that are formed on the first surface; an external connection terminal formed on the second surface and electrically connected to the semiconductor element electrode connection terminal; a conducting wire that connects the semiconductor element electrode connection terminal and the external connection terminal to each other; a resin layer formed on the metal plate; a hole portion that is partly formed in the second surface of the metal plate and does not penetrate the metal plate; and a plurality of protrusions that are formed on a bottom surface of the hole portion and protrude in a direction away from the metal plate, the protrusions having a height lower than a position of the second surface, not being in electrical conduction with the conducting wire, and being dispersed separately.

3 Claims, 4 Drawing Sheets

U.S. PATENT DOCUMENTS

| | | | |
|---|---|---|---|
| 2001/0013639 A1* | 8/2001 | Abe | 257/666 |
| 2002/0153596 A1 | 10/2002 | Tsubosaki et al. | |
| 2005/0087890 A1* | 4/2005 | Minamio et al. | 257/787 |
| 2007/0126112 A1 | 6/2007 | Cho et al. | |

FOREIGN PATENT DOCUMENTS

| | | |
|---|---|---|
| JP | 2000-286361 | 10/2000 |
| JP | 2002-299538 | 10/2002 |
| JP | 2002-314017 | 10/2002 |
| JP | 2004-104046 | 4/2004 |
| JP | 3642911 B2 | 4/2005 |
| JP | 2007-158341 | 6/2007 |
| JP | 2008-091758 | 4/2008 |
| WO | 2007/058074 A1 | 5/2007 |

* cited by examiner

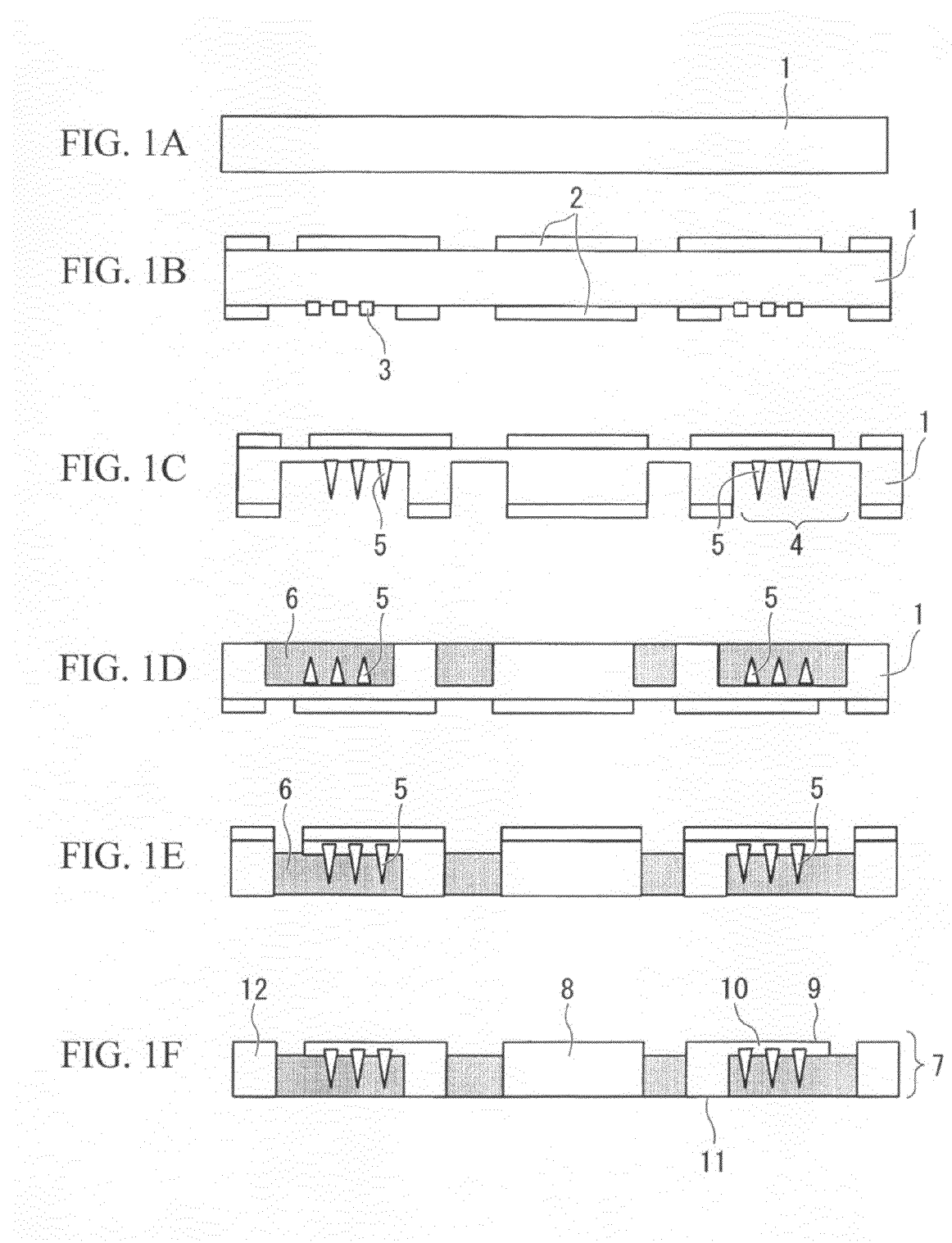

Prior Art

LEAD FRAME SUBSTRATE, MANUFACTURING METHOD THEREOF, AND SEMICONDUCTOR APPARATUS

CROSS REFERENCE TO RELATED APPLICATIONS

This application is a national phase application, under 35 U.S.C. 371, of international application No. PCT/JP2009/004932, filed on Sep. 28, 2009, which claimed priority to Japanese Patent Application No. 2008-250799, filed on Sep. 29, 2008, the disclosures of which are incorporated herein by reference.

TECHNICAL FIELD

The present invention relates to a technique using a semiconductor package substrate preferable for a packaging semiconductor element, and more particularly to a lead frame substrate, a manufacturing method of the same, and a semiconductor apparatus using the same.

BACKGROUND ART

In semiconductor packages using a lead frame which are typified by QFPs (Quad Flat Packages), outer leads for connection with a printed wiring board are arranged on side surfaces of a semiconductor package. With a desired photoresist pattern being formed on both sides of a metal plate, which is etched from both sides, a lead frame is capable of obtaining inner leads and outer leads as connection portions with a semiconductor element mount portion and semiconductor element electrodes, and also obtaining an outer frame portion that fixes these leads.

Furthermore, other than the etching method, punching by a press can be used to obtain the leads and the outer frame portion.

As assembly steps of a semiconductor package, a semiconductor element is die-bonded to a semiconductor element mount portion, and then gold wires or the like are used to electrically connect electrodes of the semiconductor element to inner leads. After that, the area in the vicinity of the semiconductor element including the inner lead portion is resin-molded, its outer frame portion is cut, and, as required, outer leads are subjected to bending work.

As for the outer lead installed on the side surface in this manner, it is said that the limit of the number of pins is 200 to 300 for a package size of 30 mm square, in terms of the machining ability for microsizing.

In recent years, with the increase in the number of electrodes of a semiconductor element, semiconductor packages of a lead frame type that has outer leads on the side surfaces have become incapable of keeping up with the number of electrodes. As a result, some of them are being replaced with semiconductor packages of a BGA (Ball Grid Array) or LGA (Land Grid Array) type or other types in which external connection terminals for connection with the printed wiring board are arranged in an array on the bottom surface of the package substrate. In a typical substrate for use in these, holes are made in a copper-clad glass epoxy substrate with a drill, and the holes are plated to provide conductivity. One surface of the substrate is formed with terminals for connection with the electrodes of the semiconductor element. The other surface is formed with external connection terminals arranged in an array.

However, this poses the following problems. The manufacture of such substrates has complex steps, leading to higher costs. In addition, reliability is inferior to that of the packages of a lead frame type because plating is used for wiring connections within the substrate.

Therefore, there is disclosed a BGA-type semiconductor package structure using a lead frame that utilizes a step of etching the lead frame from both sides (for example, see Patent Document 1).

In this structure, etching is performed simultaneously on both surfaces with the photoresist patterns being different on front and rear surfaces. Alternatively, after etching is performed on a first side, an electrodeposited polyimide resin layer is formed or a pre-mold resin is spread on a surface layer of the etched surface, and then etching is applied from a second surface. Thereby, connection terminals of the semiconductor element electrodes are formed on the first surface, and external connection terminals are formed in an array on the second surface.

CITATION LIST

Patent Document 1: Japanese Patent No. 3642911

Problems to be Solved by the Invention

FIG. 4A and FIG. 4B are schematic cross-sectional views showing a representative example of a lead frame substrate according to a prior art.

A lead frame substrate includes: a semiconductor element mount portion 8; semiconductor element electrode connection terminals 9; conducting wires 10; external connection terminals 11; and a frame portion 12. In BGA-type lead frames, with the increase in the number of the external connection terminals 11, the conducting wire 10 on the semiconductor element electrode connection terminal 9 side is longer. The conducting wire 10 is fabricated by half-etching a metal plate. It is small both in width and thickness. This brings about a problem of very low yield because of the occurrence of breakage or bending in the steps after etching.

Patent Document 1 discloses half-etching only the external connection terminal 11 side to form an electrodeposited polyimide layer 17 on the etched surface, and then forming the semiconductor element electrode connection terminal 9 side by etching. Thereby, the fine conducting wire 10 is supported by the electrodeposited polyimide layer 17, which is a thin film. This prevents the conducting wire from being broken or bent during the fabrication of the lead frame.

However, when a semiconductor element is mounted on the semiconductor element mount portion 8 of the lead frame substrate with this structure, and semiconductor element electrodes are connected to the semiconductor element electrode connection terminals 9 by wire bonding, the portions beneath the semiconductor element electrode connection terminals 9 are hollow. Therefore, there are weak forces between wire connections. This results in an occurrence of poor connection, leading to a problem of a remarkable decrease in assembly yield.

Furthermore, other conceivable countermeasures (which are not disclosed in Patent Document 1) include potting of the electrodeposited polyimide layer with a pre-mold resin to make the resin layer thicker.

With this countermeasure, it is presumed that the problem of poor bonding can be circumvented to some degree. However, it is not possible to completely circumvent the hollow state.

According to this, it is very difficult to adjust the spread amount of the pre-mold resin. If hole areas that are formed in the electrodeposited polyimide layer are larger, the central portion of the layer is thinner. This may result in a problem in that the electrodeposited polyimide layer 17 fails to support the fine conducting wire 10. Furthermore, with the central portion being thinner, there may be a further problem in that, in some cases, a perforation is made in the next step.

DISCLOSURE OF INVENTION

The present invention has been achieved in view of the aforementioned problems in the prior art, and has an object to provide: a lead frame substrate capable of supporting an increase in the number of the electrodes of a semiconductor element, high in reliability, and stable in its fabrication and assembly of a semiconductor package; a manufacturing method of the lead frame substrate; and a semiconductor apparatus.

A first aspect of the present invention is a lead frame substrate, including: a metal plate having a first surface and a second surface; a semiconductor element mount portion and a semiconductor element electrode connection terminal that are formed on the first surface; an external connection terminal formed on the second surface and electrically connected to the semiconductor element electrode connection terminal; a conducting wire that connects the semiconductor element electrode connection terminal and the external connection terminal to each other; a resin layer formed on the metal plate; a hole portion that is partly formed in the second surface of the metal plate and does not penetrate the metal plate; and a plurality of protrusions that are formed on a bottom surface of the hole portion and protrude in a direction away from the metal plate, the protrusions having a height lower than a position of the second surface, not being in electrical conduction with the conducting wire, and being dispersed separately.

A second aspect of the present invention is a manufacturing method of a lead frame substrate including: forming, on a first surface of a metal plate, a first photoresist pattern for forming a semiconductor element mount portion, a semiconductor element electrode connection terminal, and a frame portion, and also for forming, on a second surface of the metal plate, an external connection terminal and a frame portion; forming a second photoresist pattern for forming, in a region other than the external connection terminal and the frame portion of the second surface, a hole portion that does not penetrate the metal plate, and also for forming, on a bottom surface of the hole portion, a plurality of protrusions that protrude in a direction away from the metal plate, the protrusions having a height lower than a position of the second surface, not being in electrical conduction with a conducting wire, and being dispersed separately; etching a metal plate exposure portion where the second surface is exposed, to thereby form the hole portion, and protrusion-like structures that are the protrusions in an incomplete state; spreading a liquid-like pre-mold resin on the hole portion, and heating and curing the resin to form a resin layer; and etching the first surface to form the semiconductor element mount portion, the semiconductor element electrode connection terminal to be in electrical conduction with the external connection terminal, and the frame portion, and also completing the protrusion-like structures as the protrusions.

Furthermore, a third aspect of the present invention is a semiconductor apparatus, including: a lead frame substrate and a semiconductor element mounted on the lead frame substrate, the lead frame substrate including: a metal plate having a first surface and a second surface; a semiconductor element mount portion and a semiconductor element electrode connection terminal that are formed on the first surface; an external connection terminal formed on the second surface and electrically connected to the semiconductor element electrode connection terminal; a conducting wire that connects the semiconductor element electrode connection terminal and the external connection terminal to each other; a resin layer formed on the metal plate; a hole portion that is partly formed in the second surface of the metal plate and does not penetrate the metal plate; and a plurality of protrusions that are formed on a bottom surface of the hole portion and protrude in a direction away from the metal plate, the protrusions having a height lower than a position of the second surface, not being in electrical conduction with the conducting wire, and being dispersed separately, in which the lead frame substrate and the semiconductor element are electrically connected to each other by wire bonding.

According to the present invention, it is possible to arrange external connection terminals for connection with a printed wiring board in an array over a whole rear surface of a lead frame substrate. Therefore, it is possible to support an increased number of terminals of a semiconductor element.

Furthermore, the present invention includes a substrate based on a lead frame without using plated conducting wires. Therefore, it is possible to secure reliability against thermal stress.

On the other hand, in fabrication of such a lead frame substrate, no faults such as breakage or bending of a conducting wire occur. At the time of wire bonding performed in the assembly step of the semiconductor package, the lower portion of the wire-bonding connection terminal has the pre-mold resin filled uniformly on the surfaces of the external connection terminals, allowing for stable connection.

BRIEF DESCRIPTION OF THE DRAWINGS

FIG. 1A is a schematic cross-sectional view showing an exemplary manufacturing method of a lead frame substrate according to the present invention.

FIG. 1B is a schematic cross-sectional view showing the exemplary manufacturing method of a lead frame substrate according to the present invention.

FIG. 1C is a schematic cross-sectional view showing the exemplary manufacturing method of a lead frame substrate according to the present invention.

FIG. 1D is a schematic cross-sectional view showing the exemplary manufacturing method of a lead frame substrate according to the present invention.

FIG. 1E is a schematic cross-sectional view showing the exemplary manufacturing method of a lead frame substrate according to the present invention.

FIG. 1F is a schematic cross-sectional view showing the exemplary manufacturing method of a lead frame substrate according to the present invention.

BEST MODE FOR CARRYING OUT THE INVENTION

Figure 2A:
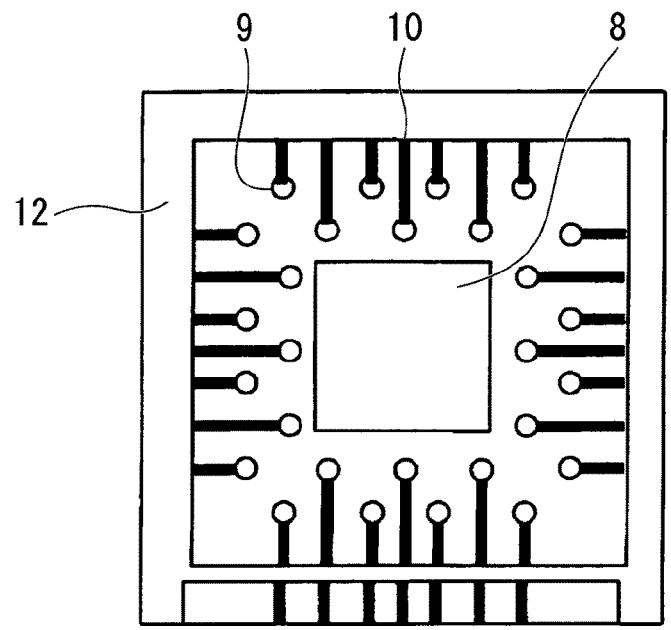
FIG. 2A is a schematic top view showing an exemplary lead frame substrate according to the present invention.

FIG. 1A to FIG. 1F are schematic cross-sectional views showing an exemplary manufacturing method of a lead frame substrate according to the present invention.

FIG. 1A shows a metal plate 1 that is used for a lead frame.

On both surfaces of the metal plate 1 used for a lead frame, a first photoresist pattern 2 is formed (FIG. 1B).

On a first surface (a top surface in FIG. 1B) of the metal plate 1, the first photoresist pattern 2 forms: a semiconductor element mount portion 8; semiconductor element electrode connection terminals 9 that are terminals for connection with semiconductor element electrodes; conducting wires 10; and a frame portion 12.

Furthermore, on a second surface (a bottom surface in FIG. 1B) of the metal plate 1, the first photoresist pattern 2 forms: external connection terminals 11; and a frame portion 12.

On the second surface of the metal plate 1, a second photoresist pattern 3 is formed. The second photoresist pattern 3 forms an appropriate number of (one or more) protrusions 5 on the second surface of the metal plate 1. To form the protrusions 5 well, the second photoresist pattern 3 is designed in the following manner. That is, it is designed so that, before completion of half etching, portions of the second resist pattern 3 in contact with the protrusions 5 are stripped, and consequently, at the time of completion of the formation of the protrusions 5 as a result of the half etching, the protrusions 5 are lower than at least the external connection terminals 11.

As the metal plate 1, any material may be used so long as it has etching workability, mechanical strength, thermal conductivity, expansion coefficient, and the like as a lead frame. Often used materials include an alloy based on iron-nickel represented by a 42 alloy, and an alloy based on copper to which various metal elements are added for enhancing mechanical strength.

Etching is performed from the bottom surface by use of an etching solution such as an iron chloride solution that dissolves the metal plate, to thereby form hole portions 4 (FIG. 1C). The remaining portion of the metal plate at the bottom portion of the hole portion 4 is finally turned into a conducting wire. Therefore, it is preferable that a thickness of approximately 10 to 50 μm of the metal plate be left so that a fine conducting wire is formed at the time of the second etching from the top surface side.

Furthermore, in the hole portion 4, at least one protrusion 5 is formed simultaneously. So long as the protrusion 5 is configured to be shorter than the height of the hole portion 4 as shown in FIG. 1C, it is possible to adjust the shape of the protrusion 5 to a cylindrical shape, a mountain-range shape or the like according to the shape of the resist. The protrusion 5 has an exposed metal surface that is not connected to other conducting wires but is electrically independent. This characterizes the lead frame substrate.

The etched metal plate is turned upside down, reversing the top and bottom surfaces. Then, a liquid-like pre-mold resin 6 is injected onto the top surface of the metal plate (FIG. 1D).

The hole portion 4 is partitioned into at least two portions by the protrusion 5. This makes it possible to form the pre-mold resin surface uniformly and flush.

Figure 2B:
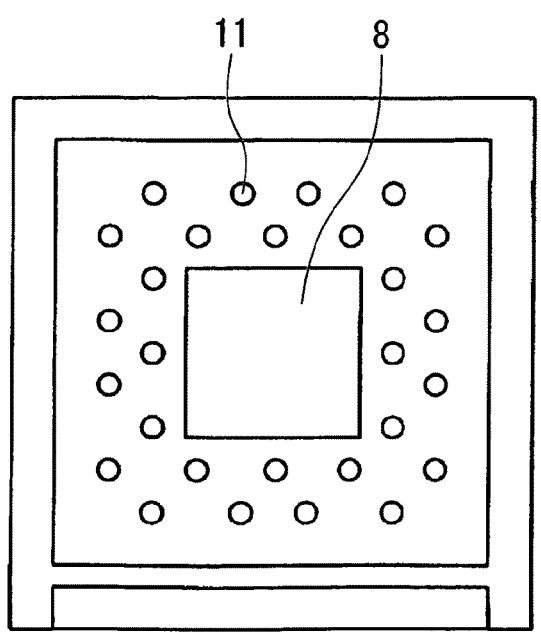
FIG. 2B is a schematic top view showing the exemplary lead frame substrate according to the present invention.

In addition, the opposite surface is etched (FIG. 1E). Thereby, a semiconductor element mount portion 8, semiconductor element electrode connection terminals 9, and conducting wires 10 are formed to fabricate a lead frame substrate 7 (FIG. 1F). The top view of the lead frame substrate 7 on the semiconductor element mount portion 8 side is shown in FIG. 2A. The top view of the lead frame substrate 7 on the external connection terminal 11 side is shown in FIG. 2B. Thus, the external connection terminals 11 can be arranged in an array, and can support an increased number of pins of the semiconductor element.

Figure 3A:
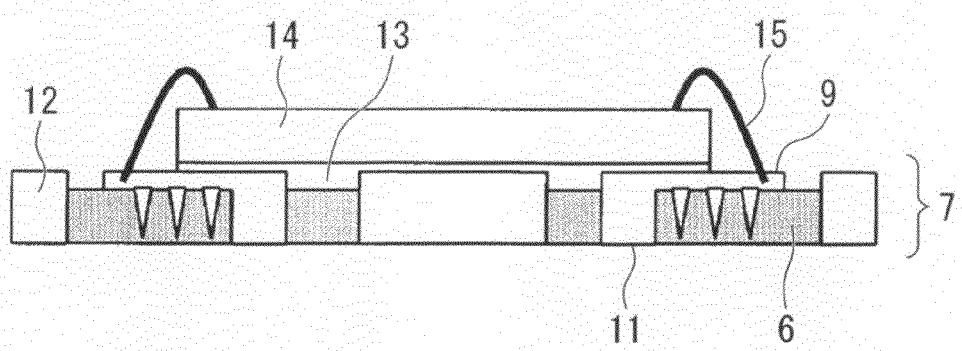
FIG. 3A is a schematic cross-sectional view showing how a semiconductor element is mounted on an exemplary lead frame substrate according to the present invention and is wire-bonded.

FIG. 3A shows a cross-sectional view in which a semiconductor element 14 is mounted on the lead frame substrate 7 and the two are wire-bonded.

The semiconductor element 14 is attached to the lead frame substrate 7 with a die attach material 13. The semiconductor element 14 and the semiconductor element electrode connection terminals 9 are connected to each other with gold wires 15. As required, the semiconductor element electrode connection terminal 9 may be appropriately subjected to any one of nickel-gold plating, tin plating, silver plating, nickel-palladium-gold plating, and the like.

For wire bonding, the lead frame substrate 7 is placed on a heat block, and a joint operation is performed while heat is being applied. At this time, beneath the semiconductor element electrode connection terminal 9, the pre-mold resin 6 is present in a flush state and does not have a hollow structure. Therefore, it is possible to assemble a semiconductor package without causing a joint failure.

Figure 3B:
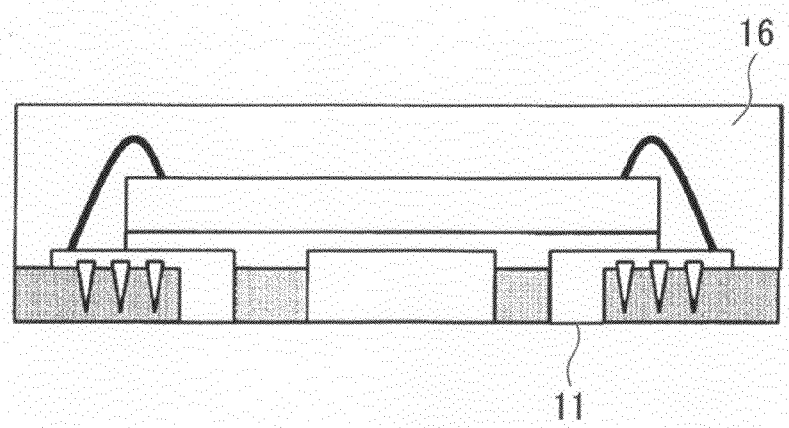
FIG. 3B is a schematic cross-sectional view showing how a semiconductor element is mounted on the exemplary lead frame substrate according to the present invention, is wire-bonded, and is transfer-molded.
Figure 4A:
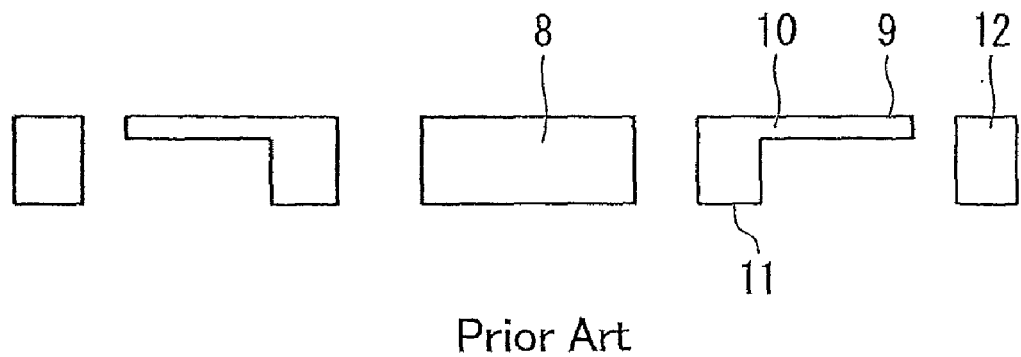
FIG. 4A is a schematic cross-sectional view showing a representative example of a lead frame substrate according to a prior art.
Figure 4B:
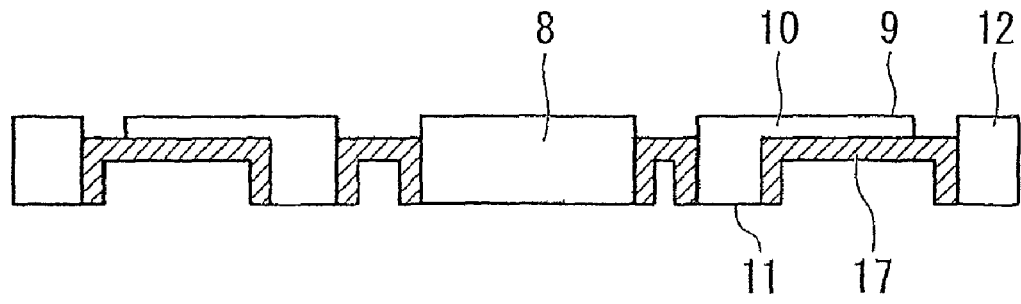
FIG. 4B is a schematic cross-sectional view showing the representative example of the lead frame substrate according to the prior art.

Lastly, the semiconductor element side of the lead frame substrate 7 is sealed by potting. Then, the frame portion 12 is separated with a diamond blade or the like into small pieces (FIG. 3B). For potting, for example, a transfer mold resin 16 may be used.

In the case of the BGA type, a semiconductor package is obtained in which the lead frame substrate 7 is used with solder balls being mounted on the external connection terminals 11.

EXAMPLES

Hereunder is a description of an exemplary manufacturing method of a lead frame substrate according to the present invention with reference to FIG. 1A to FIG. 1F, taking an LGA (Land Grid Array) type lead frame substrate by way of example.

The manufactured LGA had a package size of 10 mm square. The bottom surface of the package had 168 external connection terminals arranged in an array.

First, a metal plate 1 shown in FIG. 1A was prepared, which was a long, band-like metal plate made of copper alloy (EFTEC64T manufactured by FURUKAWA ELECTRIC CO., LTD) with a width of 150 mm and a thickness of 200 μm.

Subsequently, on both surfaces of the metal plate 1, a photoresist (OFPR4000 manufactured by TOKYO OHKA KOGYO CO., LTD.) was coated with a roll coater so as to have a thickness of 5 μm. Then, the metal plate 1 was pre-baked at 90° C.

Next, the metal plate 1 was pattern-exposed from both sides via photo masks with desired patterns. After that, the metal plate 1 was developed with a 1% solution of sodium carbonate in water, and was then washed with water and post-baked. Thereby, a first photoresist pattern 2 and a second photoresist pattern 3 shown in FIG. 1B were obtained.

As the first photoresist pattern 2, a pattern of a photoresist for forming a semiconductor element mount portion 8, semiconductor element electrode connection terminals 9, conducting wires 10, and a frame portion 12 was formed on a first surface, and moreover, a pattern of a photoresist for forming external connection terminals 11 and a frame portion 12 was formed on a second surface.

Furthermore, as the second photoresist pattern 3 for forming protrusions 5, patterns of a photoresist with a diameter of 30 μm were arranged in an array with a pitch of 0.5 mm in a non-wired portion.

Next, the first surface of the metal plate 1 was covered with a back sheet for protection (not shown in the figure). Then, a first etching treatment was performed on the metal plate 1 from the second surface by use of an iron chloride solution. Thereby, the metal plate portion exposed from the first photoresist pattern 2 on the second surface of the metal plate 1 was made thinner to a thickness of 30 μm (FIG. 1C). The iron chloride solution had a specific gravity of 1.38 and a temperature of 50° C.

The metal plate 1 with the etched second surface was immersed for five minutes in a solution of ammonium persulfate in water at 30° C. and 50 g/L, to thereby coarsen the etched surface formed by the first etching treatment (not shown in the figure). Furthermore, the metal plate 1 was immersed in a predetermined stripper based on a solution of sodium hydroxide in water, to thereby strip the photoresist on the second surface of the metal plate 1 (not shown in the figure).

Next, onto the second surface of the metal plate 1 that had been formed by the first etching treatment, a thermosetting resin (SMC-376KF1 manufactured by Shin-Etsu Chemical Co., Ltd.) corresponding to the pre-mold resin 6 was injected. Then, a full curing treatment was performed on the resin at 180° C. for three hours, to thereby form a pre-mold layer.

The thermosetting resin had good depositability. No failure such as voids was observed. Hardly no thermosetting resin was left on the unetched portions of the surfaces of the external connection terminals 11 and the frame portion 12. In combination with washing its surfaces, the metal plate 1 was treated for approximately three minutes in an alkaline solution of potassium permanganate in water (potassium permanganate at 40 g/L+sodium hydroxide at 20 g/L) at 60° C.

Next, after removal of the back sheet on the first surface of the metal plate 1, a second etching treatment was performed on the metal plate 1 from the first surface with an iron chloride solution to dissolve and remove the metal plate portions exposed from the first photoresist pattern 2. Thereby, a semiconductor element mount portion 8, semiconductor element electrode connection terminals 9, conducting wires 10, and the frame portion 12 were formed (FIG. 1E).

Each external connection terminal 11 extends from its corresponding semiconductor element electrode connection terminal 9. Although not shown in the figure, it is preferable that a back sheet or the like be adhered to the second surface at the time of the second etching treatment so as to prevent unnecessary etching on the bottom surface.

Subsequently, the first photoresist pattern 2 on the first surface of the metal plate 1 was stripped to obtain a desired LGA-type lead frame substrate 7 (FIG. 1F).

Next, after stripping of the resist, the exposed portions of the metal surface were subjected to electrolytic nickel-gold plating.

The nickel had a thickness of 5 μm, and the gold had a thickness of 0.1 μm (not shown in the figure).

Subsequently, the semiconductor element 14 was mounted on the lead frame substrate 7 by use of a die attach material 13, and was left to stand at 150° C. for one hour. Thereby, the die attach material 13 was cured. Furthermore, gold wires 15 with a diameter of 30 μm were used to wire-bond the electrodes of the semiconductor element 14 to the semiconductor element electrode connection terminals 9 (FIG. 3A). Heating temperature for the wire bonding was 200° C. The pull strength of the gold wires 15 on the semiconductor element electrode connection terminal 9 side was measured to be 9 g or greater. Thus, a favorable connection was obtained.

After that, as shown in FIG. 3B, the area including the semiconductor element 14 and the semiconductor element electrode connection terminals 9 was transfer-molded. Then, the metal plate 1 was cut into smaller pieces to obtain semiconductor packages using the LGA-type lead frame substrate 7.

INDUSTRIAL APPLICABILITY

By use of the manufacturing method of a lead frame substrate according to the present invention, it is possible to obtain a lead frame substrate in which failures at the time of manufacture and failures at the time of assembly of a semiconductor package are reduced, and reliability against thermal stress is increased. The present invention is applied especially to a multiple-pin package substrate for which a lead-frame-type semiconductor package is not yet available.

DESCRIPTION OF THE REFERENCE SYMBOLS

1: metal plate
2: first photoresist pattern
3: second photoresist pattern (for formation of protrusion)
4: hole portion
5: protrusion
6: pre-mold resin
7: lead frame substrate
8: semiconductor element mount portion
9: semiconductor element electrode connection terminal
10: conducting wire
11: external connection terminal
12: frame portion
13: die attach material
14: semiconductor element
15: gold wire
16: transfer mold resin
17: electrodeposited polyimide layer

The invention claimed is:
1. A lead frame substrate, comprising:
a metal plate having a first surface and a second surface;
a semiconductor element mount portion and a semiconductor element electrode connection terminal that are formed on the first surface;
an external connection terminal formed on the second surface and electrically connected to the semiconductor element electrode connection terminal;
a conducting wire that connects the semiconductor element electrode connection terminal and the external connection terminal to each other;
a resin layer formed on the metal plate;
a hole portion that is partly formed in the second surface of the metal plate and does not penetrate the metal plate; and
a plurality of protrusions that are formed on a bottom surface of the hole portion and protrude in a direction away from the metal plate, the protrusions having a height lower than a position of the second surface, not being in electrical conduction with the conducting wire, and being dispersed separately.

2. A manufacturing method of a lead frame substrate comprising:
   forming, on a first surface of a metal plate, a first photoresist pattern for forming a semiconductor element mount portion, a semiconductor element electrode connection terminal, and a frame portion, and also for forming, on a second surface of the metal plate, an external connection terminal and the frame portion;
   forming a second photoresist pattern for forming, in a region other than the external connection terminal and the frame portion of the second surface, a hole portion that does not penetrate the metal plate, and also for forming, on a bottom surface of the hole portion, a plurality of protrusions that protrude in a direction away from the metal plate, the protrusions having a height lower than a position of the second surface, not being in electrical conduction with a conducting wire, and being dispersed separately;
   etching a metal plate exposure portion where the second surface is exposed, to thereby form the hole portion, and protrusion-like structures that are the protrusions in an incomplete state;
   spreading a liquid-like pre-mold resin on the hole portion, and heating and curing the resin to form a resin layer; and
   etching the first surface to form the semiconductor element mount portion, the semiconductor element electrode connection terminal to be in electrical conduction with the external connection terminal, and the frame portion, and also completing the protrusion-like structures as the protrusions.

3. A semiconductor apparatus, comprising:
   a lead frame substrate and a semiconductor element mounted on the lead frame substrate,
   the lead frame substrate comprising:
   a metal plate having a first surface and a second surface;
   a semiconductor element mount portion and a semiconductor element electrode connection terminal that are formed on the first surface;
   an external connection terminal formed on the second surface and electrically connected to the semiconductor element electrode connection terminal;
   a conducting wire that connects the semiconductor element electrode connection terminal and the external connection terminal to each other;
   a resin layer formed on the metal plate;
   a hole portion that is partly formed in the second surface of the metal plate and does not penetrate the metal plate; and
   a plurality of protrusions that are formed on a bottom surface of the hole portion and protrude in a direction away from the metal plate, the protrusions having a height lower than a position of the second surface, not being in electrical conduction with the conducting wire, and being dispersed separately, wherein
   the lead frame substrate and the semiconductor element are electrically connected to each other by wire bonding.

* * * * *